(12) United States Patent
Parthasarathy et al.

(10) Patent No.: US 11,340,287 B2
(45) Date of Patent: May 24, 2022

(54) CAPACITOR WITH VISUAL INDICATOR

(71) Applicant: Intel Corporation, Santa Clara, CA (US)

(72) Inventors: Ramaswamy Parthasarathy, Bangalore (IN); Vikas Rao, Bangalore (IN); Praveen Pai, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 790 days.

(21) Appl. No.: 16/045,242

(22) Filed: Jul. 25, 2018

(65) Prior Publication Data

US 2020/0033401 A1 Jan. 30, 2020

(51) Int. Cl.
| | |
|---|---|
| *G01R 31/28* | (2006.01) |
| *G01K 11/12* | (2021.01) |
| *H05K 7/20* | (2006.01) |
| *H05K 1/02* | (2006.01) |
| *C09D 11/50* | (2014.01) |
| *H01G 2/00* | (2006.01) |

(52) U.S. Cl.
CPC .......... *G01R 31/2874* (2013.01); *G01K 11/12* (2013.01); *H05K 1/0269* (2013.01); *H05K 7/20* (2013.01); *C09D 11/50* (2013.01); *H01G 2/00* (2013.01); *H05K 2201/10015* (2013.01); *H05K 2201/10151* (2013.01); *H05K 2201/10651* (2013.01); *H05K 2203/161* (2013.01)

(58) Field of Classification Search
None
See application file for complete search history.

(56) References Cited

U.S. PATENT DOCUMENTS

| | | | | |
|---|---|---|---|---|
| 5,568,054 A | * | 10/1996 | Iino | G01R 31/2868 324/750.05 |
| 5,673,028 A | * | 9/1997 | Levy | G01D 7/005 116/209 |
| 2004/0182284 A1 | * | 9/2004 | Belykh | C04B 35/6309 106/461 |
| 2005/0224791 A1 | * | 10/2005 | Boyd | H05K 1/0269 257/48 |
| 2008/0057777 A1 | * | 3/2008 | O'Rourke | H01R 29/00 439/489 |
| 2018/0063959 A1 | * | 3/2018 | Chien | H01G 9/08 |
| 2018/0088173 A1 | * | 3/2018 | Won | G01R 31/2874 |

\* cited by examiner

*Primary Examiner* — Jas A Sanghera
(74) *Attorney, Agent, or Firm* — Schwabe, Williamson & Wyatt, P.C.

(57) ABSTRACT

Embodiments include a method of stress testing an electronics package with components that include a visual indicator. In an embodiment, the method comprises populating a plurality of components on an electronics package. In an embodiment, the plurality of components each comprise a visual indicator that is responsive to heat. In an embodiment, the method further comprises stress testing the electronics package and categorizing the plurality of components based on the visual indicators. In an embodiment, the method may further comprise modifying the plurality of components.

27 Claims, 8 Drawing Sheets

CAPACITOR WITH VISUAL INDICATOR

TECHNICAL FIELD

Embodiments of the disclosure are in the field of electronics packaging and, in particular, capacitors that comprise a visual indicator for use in stress testing electronics packages.

BACKGROUND

Platform design guides (PDGs) generated by component manufacturers are supplied to original equipment manufacturers (OEMs) for use in assembling the components in a product. The component manufacturers generate the PDGs using simulation metrics that are suitable for most uses, including corner cases. As such, many OEMs will not follow the platform design guides, and instead rely on their own best judgments based on the configuration and performance of their specific product.

For example, OEMs will typically reduce the power delivery bill of materials (PDBOM) in order to save costs even when the PDG stipulates that reducing the PDBOM may result in reduced reliability. In a particular case, the OEM may reduce the number of power delivery components (e.g., capacitors). Currently, aside from the PDG, there is no other metric that can be given to OEMs to clearly and simply depict the effect of variations to the PDBOM on reliability. Accordingly, reliability of systems may be diminished since the OEMs do not follow the PDG.

DESCRIPTION OF THE EMBODIMENTS

Figure 1A:
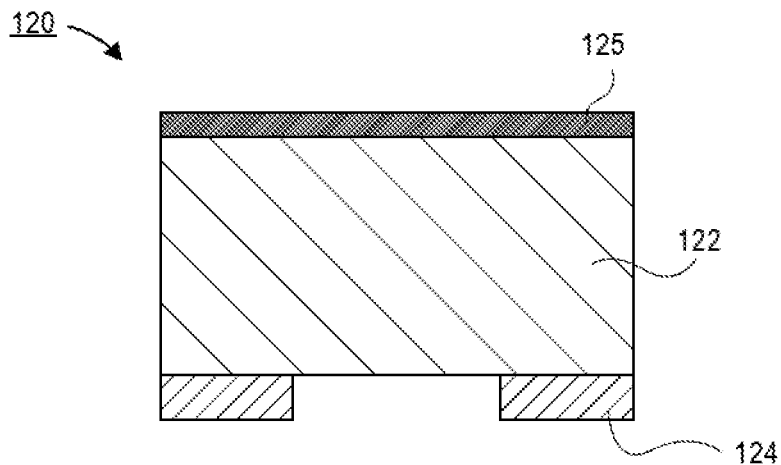
FIG. 1A is a cross-sectional illustration of a capacitor with a visual indicator on a top surface of the capacitor, in accordance with an embodiment.

Embodiments described herein comprise systems with capacitors with visual indicators and methods of using such capacitors in order to verify the reliability of a system. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, there is currently no available metric that can be supplied to OEMs to provide reliability data for individual modifications to the power delivery bill of materials (PDBOM). Accordingly, embodiments disclosed herein include power delivery components (e.g., capacitors) that include visual indicators that may be used in conjunction with testing (e.g., reliability testing). In an embodiment, the visual indicators provide an easily identifiable indication of the performance of a given power delivery component.

In an embodiment, the power delivery components may be classified as operating in two or more performance bands. For example, a capacitor may operate in a first band (i.e., underutilized), a second band (i.e., optimal performance), or a third band (i.e., over stressed). By categorizing the capacitors in such performance bands, an OEM may be able to visually determine if a given configuration will suffer from reliability issues. Furthermore, the OEM may be able to optimize a power delivery configuration (e.g., by removing underutilized capacitors). As such, the OEM may be able to reduce the PDBOM using reliable metrics that ensure high reliability.

In an embodiment, the visual indicator may correspond to an operating parameter of the power delivery component. For example, the operating parameter of interest in a capacitor may be current flow across the capacitor. Heat is generated in the capacitor as current flows across the capacitor. The temperature increase of the capacitor from the heat can be correlated to the amount of current passing across the capacitor. Accordingly, embodiments may include a visual indicator that is responsive to changes in the temperature of the capacitor in order to provide a visual indication of the amount of current passing across the capacitor. It has been shown that in capacitors of interest to embodiments disclosed herein (e.g., capacitors for power delivery in electronics packaging applications) the temperature difference between an overstressed capacitor and an underutilized capacitor may be 3° C. or greater, 5° C. or greater, 10° C. or greater, 20° C. or greater, 30° C. or greater, or 40° C. or greater.

As such, embodiments include a thermochromic visual indicator that is designed to change color at predetermined temperatures, with each color corresponding to a band of operation. Depending on the needs of the device, the visual indicator may have a single color change temperature or two or more color change temperatures. In embodiments with a single color change, a first color may correspond to an underutilized capacitor and the second color may correspond to a capacitor that is being utilized. Alternative embodiments with a single color change may include a first color that corresponds to a capacitor that is not overstressed and a second color that corresponds to a capacitor that is overstressed. In embodiments that include a visual indicator with at least two color changing temperatures, a first color may correspond to an underutilized capacitor, a second color may correspond to an optimally utilized capacitor, and a third color may correspond to an overstressed capacitor. As used herein, the power delivery component is referred to as a capacitor. However, it is to be appreciated that other components utilized in power delivery systems may also be used in accordance with an embodiment. For example, the performance of an inductor may also be categorized by a visual indicator that is responsive to temperature.

Referring now to FIG. 1A, a cross-sectional illustration of a capacitor 120 that includes visual indicator 125 is shown, in accordance with an embodiment. In an embodiment, the visual indicator 125 may be formed over a capacitor body 122. In an embodiment, the visual indicator 125 may be formed on a surface of the capacitor body 122 opposite from the electrical contacts 124. In an embodiment, the visual indicator 125 may cover an entire surface of capacitor body 122. However, it is to be appreciated that the visual indicator 125 need not cover an entire surface of the capacitor body 122 in some embodiments.

In an embodiment, the visual indicator 125 may be responsive to heat generated by the capacitor 120. For example, an increase in the temperature of the capacitor body 122 may be detectible by a change (e.g., a change in color) of the visual indicator 125. In a particular embodiment, the visual indicator 125 may be a thermochromic visual indicator. That is, the visual indicator 125 may be a first color when a temperature of the capacitor body 122 is within a first temperature range, and the visual indicator 125 may be a second color when the temperature of the capacitor body 122 is within a second temperature range. In some embodiments the visual indicator 125 may also be a third color when the temperature of the capacitor body 122 is within a third temperature range.

In an embodiment, the visual indicator 125 may be a thermochromic paint. In some embodiments, the visual indicator 125 may be painted over the surface of the capacitor body 122. For example, the visual indicator 125 may be painted with the thermochromic paint by the manufacturer of the capacitor, by the end user of the capacitor, or by any other party that may obtain the capacitor 120. In an embodiment, the visual indicator 125 may be a sticker or any other component that is attachable and in thermal communication with the capacitor body 122.

In an embodiment, the visual indicator may be a permanent visual indicator. That is, the color change is not reversible. For example, after a visual indicator 125 changes from a first color to a second color when the temperature of the capacitor body 122 raises above predetermined temperature, the second color will not revert back to the first color when the temperature of the capacitor body falls back below the predetermined temperature. In an alternative embodiment, the visual indicator may be reversible. For example, after a visual indicator 125 changes from a first color to a second color when the temperature of the capacitor body 122 raises above predetermined temperature, the second color will revert back to the first color when the temperature of the capacitor body falls back below the predetermined temperature.

Figure 1B:
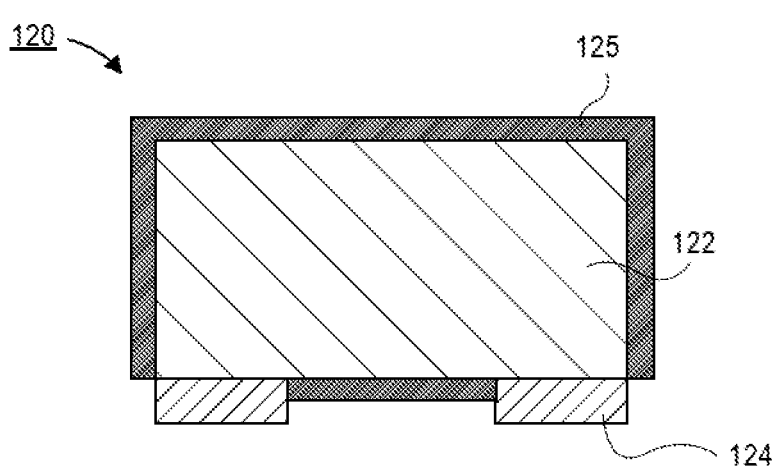
FIG. 1B is a cross-sectional illustration of a capacitor with a visual indicator over a plurality of surfaces of the capacitor, in accordance with an embodiment.

Referring now to FIG. 1B, a cross-sectional illustration of a capacitor 120 with a visual indicator 125 is shown, in accordance with an additional embodiment. Capacitor 120 in FIG. 1B may be substantially similar to the capacitor 120 illustrated in FIG. 1A, with the exception that visual indicator 125 is formed over more than one surface of the capacitor body 122. In an embodiment, the visual indicator 125 may be formed over all surfaces of the capacitor body 122. For example, the visual indicator 125 may be a layer coating an outer surface of the capacitor body 122. While all surfaces of the capacitor body 122 are shown as being covered by the visual indicator 125, it is to be appreciated that embodiments may include a visual indicator 125 formed over any percentage of the surface of the capacitor body 122.

Furthermore, while the visual indicator 125 is shown as being entirely over a surface of the capacitor body 122, it is to be appreciated that embodiments may include a visual indicator 125 that is partially embedded in the surface of the capacitor body 122, or forms an integral portion of the capacitor body 122. For example, a capacitor manufacturer may integrate visual indicator technology (such as visual indicators disclosed herein) into the capacitor body 122 or any other component of the capacitor 120.

Figure 1C:
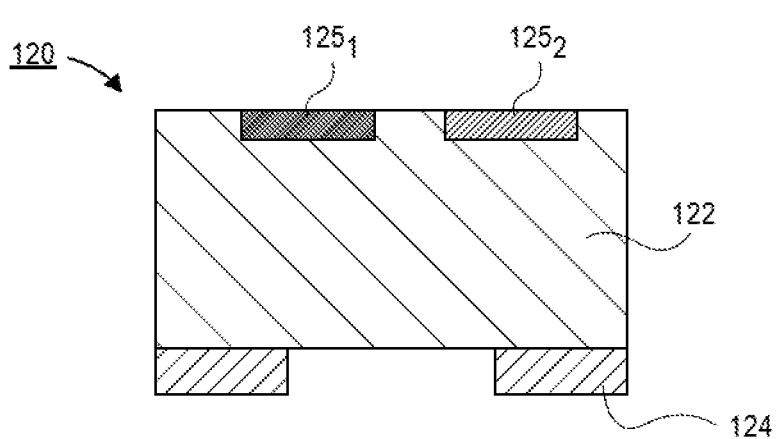
FIG. 1C is a cross-sectional illustration of a capacitor with a first visual indicator and a second visual indicator, in accordance with an embodiment.

Referring now to FIG. 1C, a cross-sectional illustration of a capacitor 120 with a plurality of visual indicators $125_1$ and $125_2$ is shown, in accordance with an embodiment. In an embodiment, a plurality of visual indicators 125 may be useful when each visual indicator is limited to a single color change. For example, the first visual indicator $125_1$ may have a color change that indicates whether a capacitor is underutilized, and the second visual indicator $125_2$ may have a color change that indicates whether a capacitor is overstressed. In such an embodiment, a single paint with a plurality of color changes is not needed, since each visual indicator 125 only needs to have a single color change temperature.

Figure 2A:
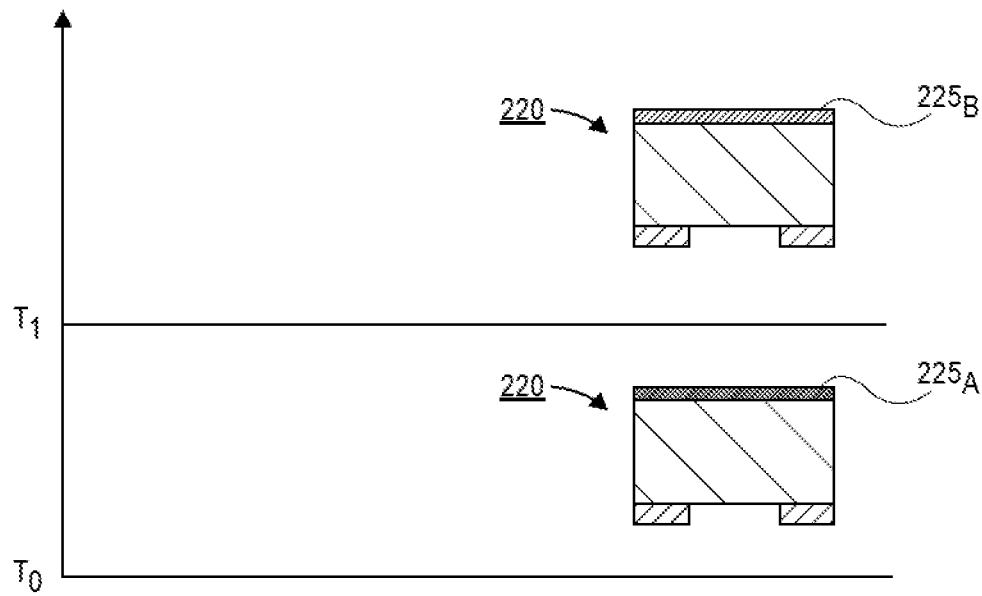
FIG. 2A is a chart that illustrates a capacitor in a first band when the temperature is below a first temperature and a capacitor in a second band when the temperature is above the first temperature, in accordance with an embodiment.

Referring now to FIG. 2A, a chart that illustrates how visual indicators may be used in order to improve reliability testing, in accordance with an embodiment. In the illustrated chart, temperature is represented on the vertical axis. At temperatures between $T_0$ (i.e., the temperature of a component that is not in use) and a first temperature $T_1$ the capacitor 220 may have a visual indicator 225 that represents a first operating band $225_A$. At temperatures above the first temperature $T_1$ the capacitor 220 may have a visual indicator 225 that represents a second operating band $225_B$. That is, at the first temperature $T_1$, the visual indicator changes from the first operating band $225_A$ to the second operating band $225_B$. Since the temperature of the capacitor can be correlated to the amount of current that passes across the capacitor, bands of temperatures (e.g., represented as a color by the visual indicators) can be used to categorize the performance band of the capacitor during testing.

In some embodiments, the first temperature $T_1$ may be a temperature that represents the boundary between a capacitor that is underutilized (i.e., the current passing over the capacitor is below what is expected) and a capacitor that is operating (i.e., the current passing over the capacitor is such that the capacitor is being used). Alternatively, the first temperature $T_1$ may be a temperature that represents the boundary where a capacitor becomes overstressed (i.e., the amount of current passing over the capacitor is such that a reliability issue may be present).

Figure 2B:
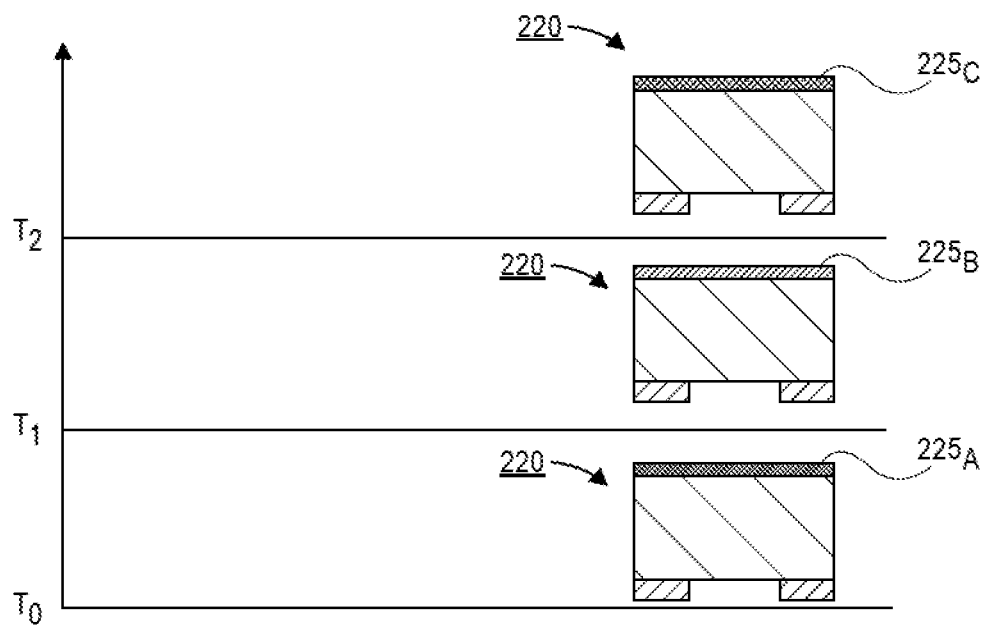
FIG. 2B is a chart that illustrates a capacitor in a first band when the temperature is below a first temperature, a capacitor in a second band when the temperature is between the first temperature and the second temperature, and a capacitor in a third band when the temperature is above the second temperature, in accordance with an embodiment.

While an embodiment that includes a visual indicator that undergoes a single band change is shown in FIG. 2A, it is to be appreciated that embodiments are not limited to a capacitor with a single band change. For example, in FIG. 2B a chart that illustrates a capacitor with a plurality of band changes is shown, in accordance with an embodiment.

In the illustrated chart, temperature is represented on the vertical axis. At temperatures between $T_0$ (i.e., the temperature of a component that is not in use) and a first temperature $T_1$ the capacitor 220 may have a visual indicator 225 that represents a first operating band $225_A$. At temperatures between the first temperature $T_1$ and a second temperature $T_2$ the capacitor 220 may have a visual indicator 225 that represents a second operating band $225_B$. At temperatures above the second temperature $T_2$ the capacitor 220 may have a visual indicator 225 that represents a third operating band $225_C$. That is, at the first temperature $T_1$, the visual indicator 225 changes from the first operating band $225_A$ to the second operating band $225_B$, and at the second temperature $T_2$ the visual indicator 225 changes from the second operating band $225_B$ to the third operating band $225_C$.

In such an embodiment, the first operating band $225_A$ may represent a capacitor that is underutilized, the second operating band $225_B$ may represent a capacitor that is operating in an optimal range, and the third operating band $225_C$ may represent a capacitor that is operating in an overstressed range that may result in reliability issues.

In an embodiment, capacitors with visual indicators such as those described above may be used during testing of a system in order to determine an optimal number of capacitors to provide a desired performance. For example, the testing may result in the identification of capacitors that are underutilized and/or overstressed. As such, embodiments allow for the PDBOM to be minimized by removing only underutilized capacitors and ensures that no (or fewer) capacitors are operated in an overstressed band.

Figure 3:
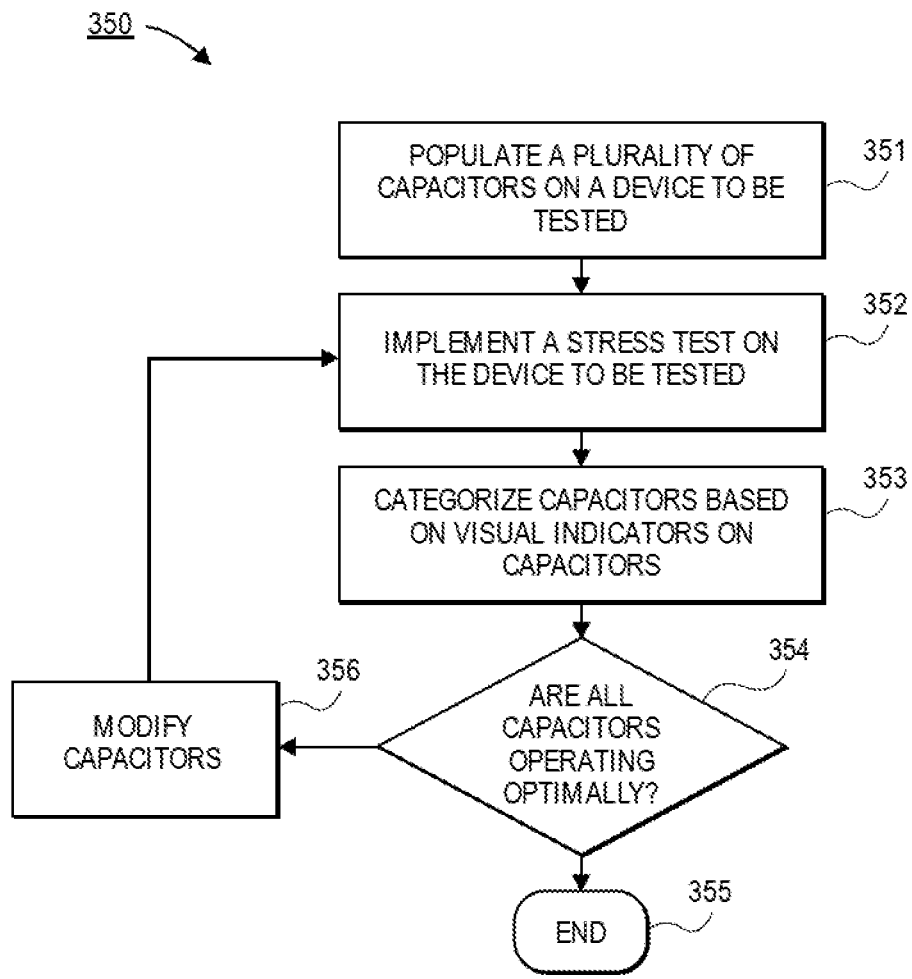
FIG. 3 is a process flow diagram of a process for using capacitors with a visual indicator, in accordance with an embodiment.

A method of testing a system in conjunction with capacitors with visual indicators is shown in process flow 350 illustrated in FIG. 3. Generically, process flow 350 may comprise, operation 351 which includes populating a plurality of capacitors on a device to be tested. In an embodiment, the capacitors may comprise a visual indicator, such as those described above. Process flow 350 may then continue with operation 352 which includes implementing a stress test on the device to be tested. In an embodiment, process flow 350 may continue with operation 353 which includes categorizing the capacitors based on the visual indicators on the capacitors. Process flow 350 may then continue with operation 354 which includes determining if all of the capacitors are operating optimally. If all of the capacitors are operating optimally, the process 350 may be ended at operation 355. Otherwise, process flow 350 may continue to operation 356 which includes modifying the capacitors, and repeating operation 352. Examples of the process flow 350 being implemented are provide with respect to FIGS. 4A-6C.

Figure 4A:
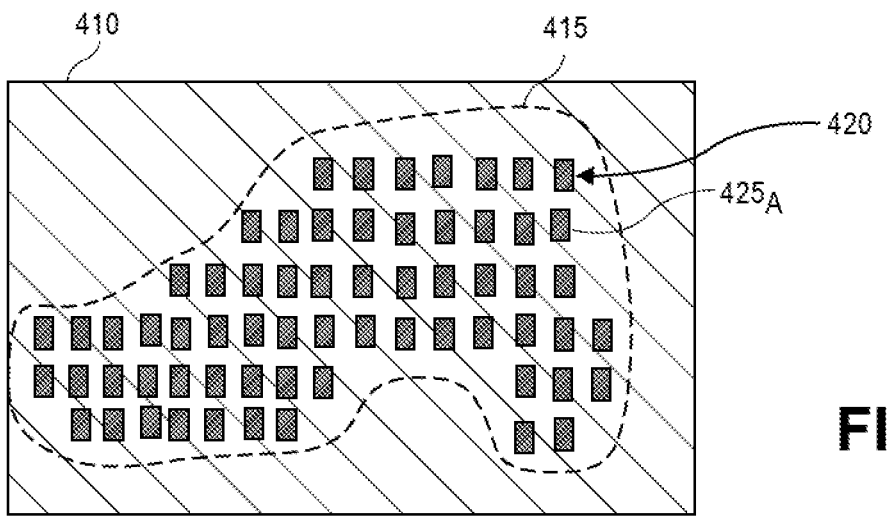
FIG. 4A is a plan view illustration of a system comprising a plurality of capacitors with visual indicators before testing, in accordance with an embodiment.
Figure 4B:
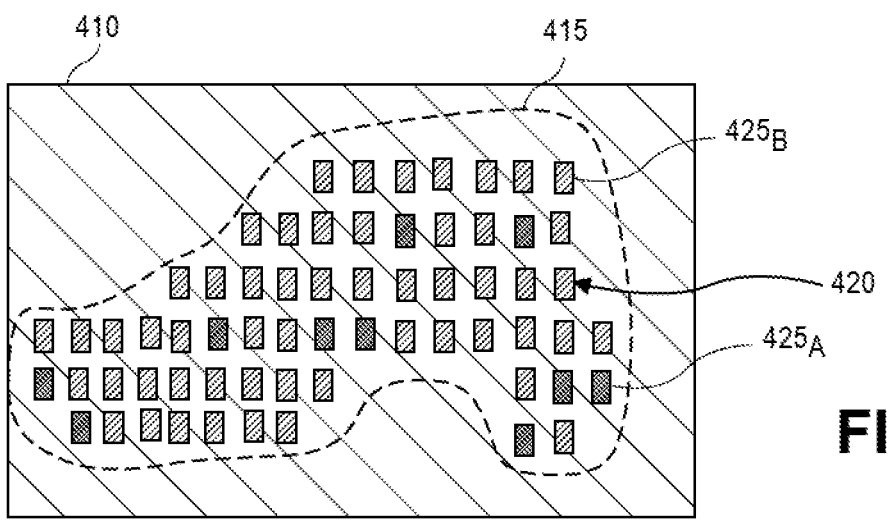
FIG. 4B is a plan view illustration of the system in FIG. 4A after testing, in accordance with an embodiment.
Figure 4C:
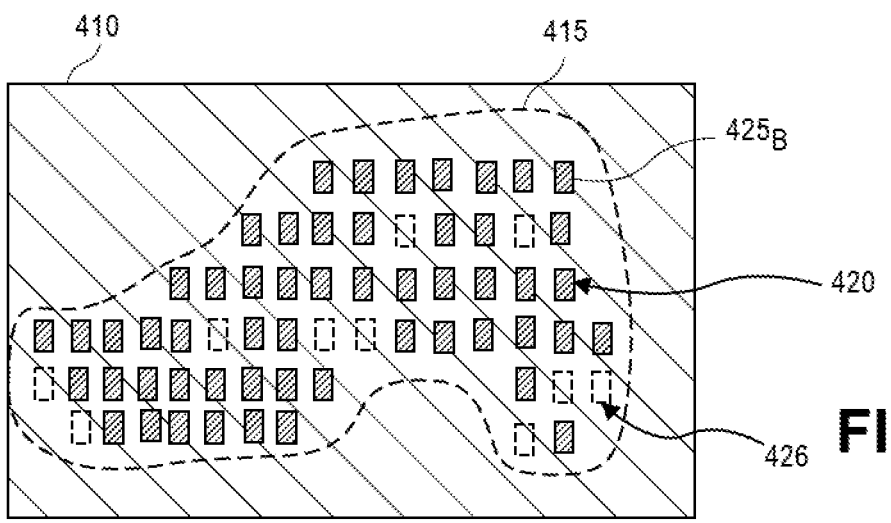
FIG. 4C is a plan view illustration of the system in FIG. 4B after a set of capacitors are removed and the system is retested, in accordance with an embodiment.

Referring now to FIGS. 4A-4C, a series of plan view illustrations of a device under test are shown during the process flow 350 is shown, in accordance with an embodiment. In FIGS. 4A-4C, the visual indicators are used to indicate the presence of underutilized capacitors.

Referring now to FIG. 4A, a plan view illustration of a system 410 that is populated with a plurality of capacitors 420 with visual indicators 425 (i.e., operation 351) is shown, in accordance with an embodiment. In an embodiment, the capacitors 420 may be electrically coupled to a power rail 415 (illustrated with a dashed line). The power rail 415 may be any arbitrary shape suitable for the needs of the system 410. In an embodiment, the system 410 may include a board and any other packages and/or components (e.g., processors, memories, etc.) (not shown) needed for the system. In an embodiment, the plurality of capacitors 420 may include tens of capacitors 420, hundreds of capacitors 420, or thousands of capacitors 420. As illustrated, each of the capacitors 420 are shown with visual indicators that are in a first band $425_A$. The capacitors 420 may be in a first band $425_A$ since they are not currently being tested (and therefore, are all unused at the moment).

Referring now to FIG. 4B, a plan view illustration of the system 410 during the implementation of a stress test on the system 410 is shown (i.e., operation 352), in accordance with an embodiment. As shown, a first set of the capacitors 420 have switched bands to the second band $425_B$, indicating that they are being used during the stress test on the system 410. In an embodiment, the second set of capacitors 420 may remain in the first band $425_A$, indicating that they are being underutilized during the stress test on the system 410.

In some embodiments, the categorization (i.e., operation 353) of what band the capacitors 420 are in may be made during the testing process. Such an embodiment may be beneficial when the visual indicators are reversible since after the testing is completed, the visual indicators will all return to the first band $425_A$. In some embodiments, the categorization (i.e., operation 353) of what band the capacitors 420 are in may be made after the testing process is completed. Such an embodiment may be beneficial when the visual indicators are permanent, and the change in band will be persistent regardless of whether the system is operating or not.

In the embodiment illustrated in FIG. 4B, not all of the capacitors 420 are operating optimally (i.e., operation 354). For example, the second set of capacitors 420 that remained in the first band $425_A$ were underutilized. As such, the plurality of capacitors 420 may be modified (i.e., operation 356). In some embodiments, the plurality of capacitors 420 may be modified by removing the capacitors 420 that remained in the first band $425_A$. It is presumed that removing the underutilized capacitors 420 will not negatively affect reliability or performance since a significant amount of current did not pass over the underutilized capacitors 420.

Referring now to FIG. 4C, a plan view illustration after the capacitors 420 are modified (i.e., operation 356) and retested (i.e., operation 352) is shown, in accordance with an embodiment. In the illustrated embodiment, the capacitors 420 that were underutilized in FIG. 4B have been removed (as indicated by the dashed boxes 426). Furthermore, it is to be appreciated that the remaining capacitors 420 are now all operating. As such, the processing flow 350 may be ended (i.e., operation 355).

It is to be appreciated that the embodiment illustrated in FIG. 4A-4C does not necessarily ensure that the capacitors 420 are not overstressed since the visual indicators only provide a single band change. However, a second test implemented with a second set of capacitors that comprise a visual indicator targeted at overstressed capacitors may be implemented (e.g., as will be described with respect to FIG. 5A-5C), or a single test with capacitors that comprise a visual indicator that include a plurality of band changes may be implemented (e.g., as will be described with respect to FIGS. 6A-6C).

Figure 5A:
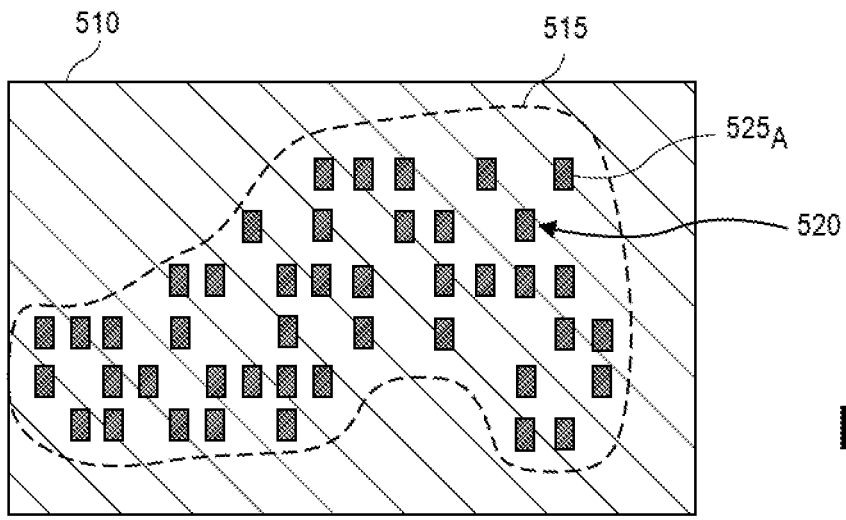
FIG. 5A is a plan view illustration of a system comprising a plurality of capacitors with visual indicators before testing, in accordance with an embodiment.

Referring now to FIG. 5A, a plan view illustration of a system 510 with a plurality of capacitors 520 populated (i.e., operation 351) is shown, in accordance with an embodiment. In an embodiment, the capacitors 520 may be electrically coupled to a power rail 515 (illustrated with a dashed line). The power rail 515 may be any arbitrary shape suitable for the needs of the system 510. In an embodiment, the system 510 may include a board and any other packages and/or components (e.g., processors, memories, etc.) (not shown) needed for the system. In an embodiment, the plurality of capacitors 520 may include tens of capacitors 520, hundreds of capacitors 520, or thousands of capacitors 520. As illustrated, each of the capacitors 520 are shown with visual indicators that are in a first band $525_A$. The capacitors 520 may be in a first band $525_A$ since they are not currently being tested (and therefore, are all unused at the moment).

Figure 5B:
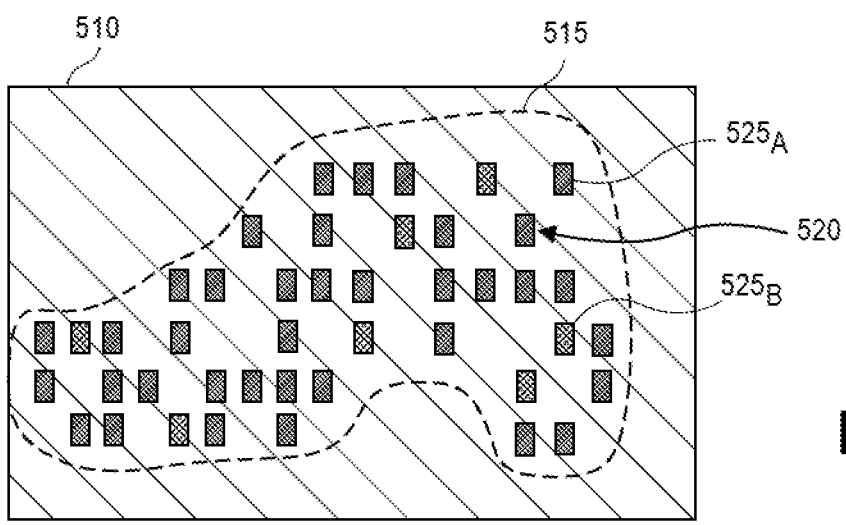
FIG. 5B is a plan view illustration of the system in FIG. 5A after testing, in accordance with an embodiment.

Referring now to FIG. 5B, a plan view illustration of the system 510 during the implementation of a stress test on the system 510 is shown (i.e., operation 352), in accordance with an embodiment. As shown, a first set of the capacitors 520 have switched bands to the second band $525_B$, indicating that they are being overstressed during the stress test on the system 510. In an embodiment, the second set of capacitors 520 may remain in the first band $525_A$, indicating that they are not being overstressed during the stress test on the system 510.

In some embodiments, the categorization (i.e., operation 353) of what band the capacitors 520 are in may be made during the testing process. Such an embodiment may be beneficial when the visual indicators are reversible since after the testing is completed, the visual indicators will all return to the first band $525_A$. In some embodiments, the categorization (i.e., operation 353) of what band the capacitors 520 are in may be made after the testing process is completed. Such an embodiment may be beneficial when the visual indicators are permanent, and the change in band will be persistent regardless of whether the system is operating or not.

In the embodiment illustrated in FIG. 5B, not all of the capacitors 520 are operating optimally (i.e., operation 354). For example, the first set of capacitors 520 that changed to the second band $525_B$ were overstressed. As such, the plurality of capacitors 520 may be modified (i.e., operation 356). In some embodiments, the plurality of capacitors 520 may be modified by adding capacitors 520 proximate to the capacitors 520 that changed from the first band $525_A$ to the second band $525_B$.

Figure 5C:
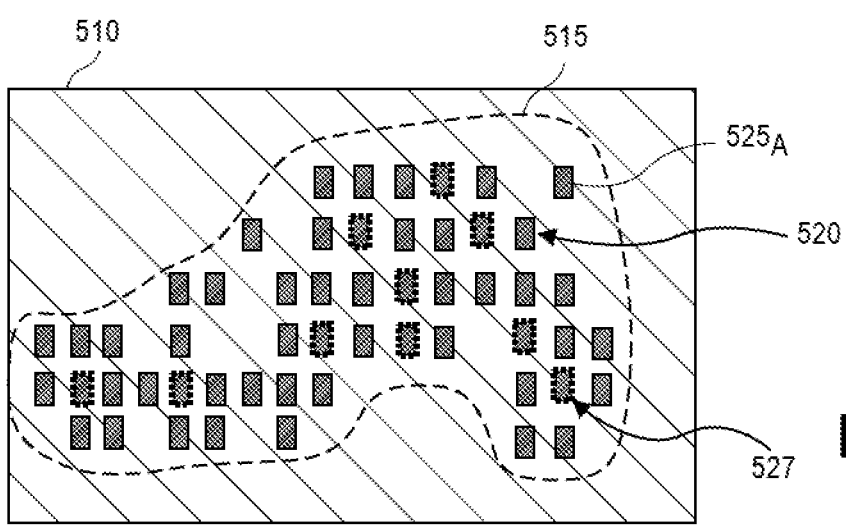
FIG. 5C is a plan view illustration of the system in FIG. 5B after a set of capacitors are added and the system is retested, in accordance with an embodiment.

Referring now to FIG. 5C, a plan view illustration after the capacitors 520 are modified (i.e., operation 356) and retested (i.e., operation 352) is shown, in accordance with an embodiment. In the illustrated embodiment, the capacitors 520 that were overstressed in FIG. 5B are now not overstressed since additional capacitors are added (as indicated by dashed boxes 527). As such, the processing flow 350 may be ended (i.e., operation 355).

Figure 6A:
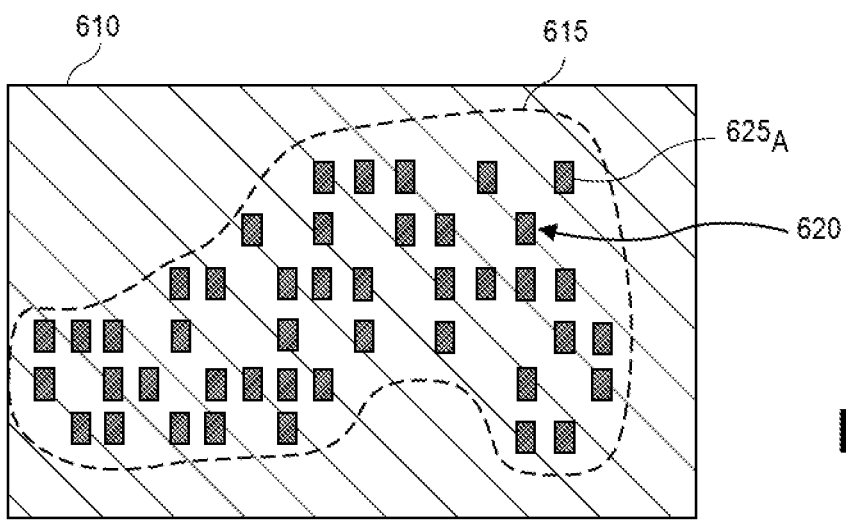
FIG. 6A is a plan view illustration of a system with a plurality of capacitors with visual indicators before testing, in accordance with an embodiment.

Referring now to FIG. 6A, a plan view illustration of a system 610 with a plurality of capacitors 620 populated (i.e., operation 351) is shown, in accordance with an embodiment. In an embodiment, the capacitors 620 may be electrically coupled to a power rail 615 (illustrated with a dashed line). The power rail 615 may be any arbitrary shape suitable for the needs of the system 610. In an embodiment, the system 610 may include a board and any other packages and/or components (e.g., processors, memories, etc.) (not shown) needed for the system. In an embodiment, the plurality of capacitors 620 may include tens of capacitors 620, hundreds of capacitors 620, or thousands of capacitors 620. As illustrated, each of the capacitors 620 are shown with visual indicators that are in a first band $625_A$. The capacitors 620 may be in a first band $625_A$ since they are not currently being tested (and therefore, are all unused at the moment).

Figure 6B:
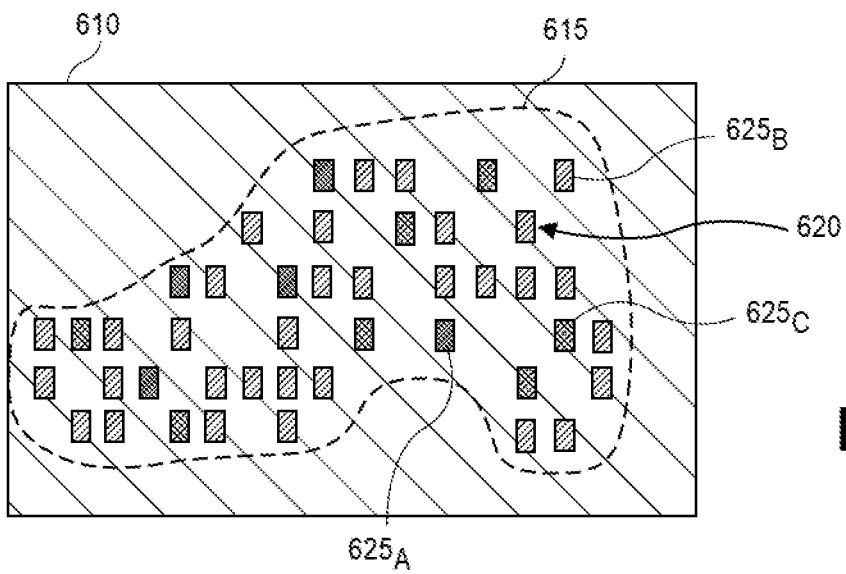
FIG. 6B is a plan view illustration of the system in FIG. 6A after testing, in accordance with an embodiment.

Referring now to FIG. 6B, a plan view illustration of the system 610 during the implementation of a stress test on the system 610 is shown (i.e., operation 352), in accordance with an embodiment. As shown, a first set of capacitors 620 may remain in the first band $625_A$, indicating that they are not being utilized during the stress test on the system 610. In an embodiment, a second set of capacitors 620 may have switched to a second band $625_B$, indicating that they are operating optimally. In an embodiment, a third set of the capacitors 620 have switched bands to a third band $625_C$, indicating that they are being overstressed during the stress test on the system 610.

In some embodiments, the categorization (i.e., operation 353) of what band the capacitors 620 are in may be made during the testing process. Such an embodiment may be beneficial when the visual indicators are reversible since after the testing is completed, the visual indicators will all return to the first band $625_A$. In some embodiments, the categorization (i.e., operation 353) of what band the capacitors 620 are in may be made after the testing process is completed. Such an embodiment may be beneficial when the visual indicators are permanent, and the change in band will be persistent regardless of whether the system is operating or not.

In the embodiment illustrated in FIG. 6B, not all of the capacitors 620 are operating optimally (i.e., operation 354). For example, the first set of capacitors 620 that remained in the first band $625_A$ were underutilized and the third set of capacitors 620 that changed to the third band $625_C$ were overstressed. As such, the plurality of capacitors 620 may be modified (i.e., operation 356). In some embodiments, the plurality of capacitors 620 may be modified by adding capacitors 620 proximate to the capacitors 620 that changed to the third band $625_C$ and by removing the capacitors 620 that remained in the first band $625_A$.

Figure 6C:
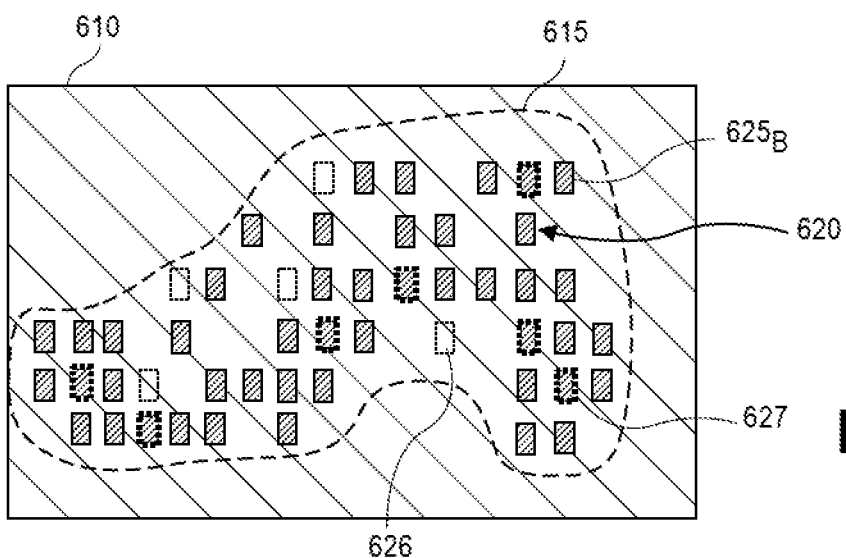
FIG. 6C is a plan view illustration of the system in FIG. 6B after a first set of capacitors are added and a second set of capacitors are removed, in accordance with an embodiment.

Referring now to FIG. 6C, a plan view illustration after the capacitors 620 are modified (i.e., operation 356) and retested (i.e., operation 352) is shown, in accordance with an embodiment. In the illustrated embodiment, the capacitors 620 that were overstressed in FIG. 6B are now not overstressed since additional capacitors 620 are added (as shown by dashed boxes 627), and underutilized capacitors are removed (as indicated by dashed boxes 626). As such, the processing flow 350 may be ended (i.e., operation 355).

While the embodiment illustrated in FIGS. 6A-6C envisions the use of a visual indicator 625 with three different bands: first band (i.e., underutilized); second band (i.e., optimal performance); and third band (i.e., overstressed operation), it is to be appreciated that the visual indicators may provide any number of different bands. For example, visual indicators with more than three bands may be used to provide improved resolution on the functionality of the capacitors of a given system.

Figure 7:
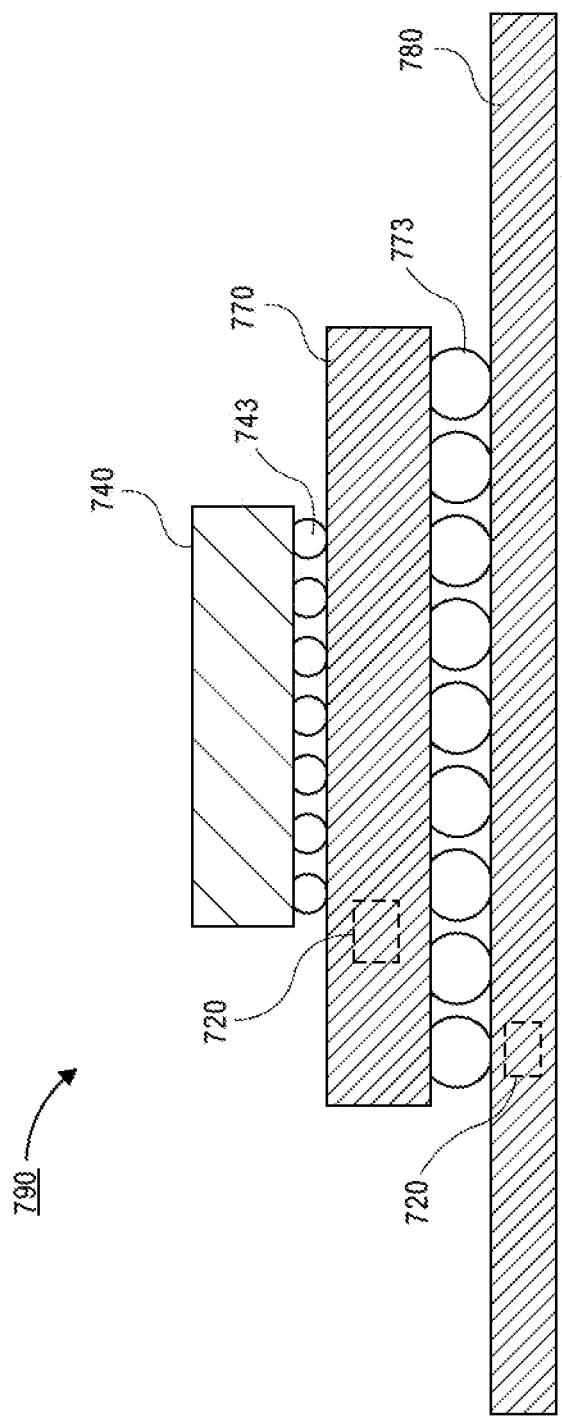
FIG. 7 is a cross-sectional illustration of an electronic package that includes a plurality of capacitors with visual indicators, in accordance with an embodiment.

Referring now to FIG. 7, a cross-sectional illustration of a packaged system 790 is shown, in accordance with an embodiment. In an embodiment, the packaged system 790 may include a die 740 electrically coupled to a package substrate 770 with solder bumps 743. In additional embodiments, the die 740 may be electrically coupled to the package substrate 770 with any suitable interconnect architecture, such as wire bonding or the like. The package substrate 770 may be electrically coupled to a board 780, such as a printed circuit board (PCB) with solder bumps 773 or any other suitable interconnect architecture, such as wire bonding or the like.

In an embodiment, a plurality of capacitors 720 with visual indicators similar to embodiments described above may be integrated into or on the package substrate 770 or the board 780, or the package substrate 770 and the board 780. Embodiments include any number of capacitors 720 formed into or on the package substrate 770 and the board 780. For example, a plurality of capacitors 720 may be integrated into the circuitry of the package substrate 770 or the board 780, or the package substrate 770 and the board 780 for power management, filtering, or any other desired use.

Figure 8:
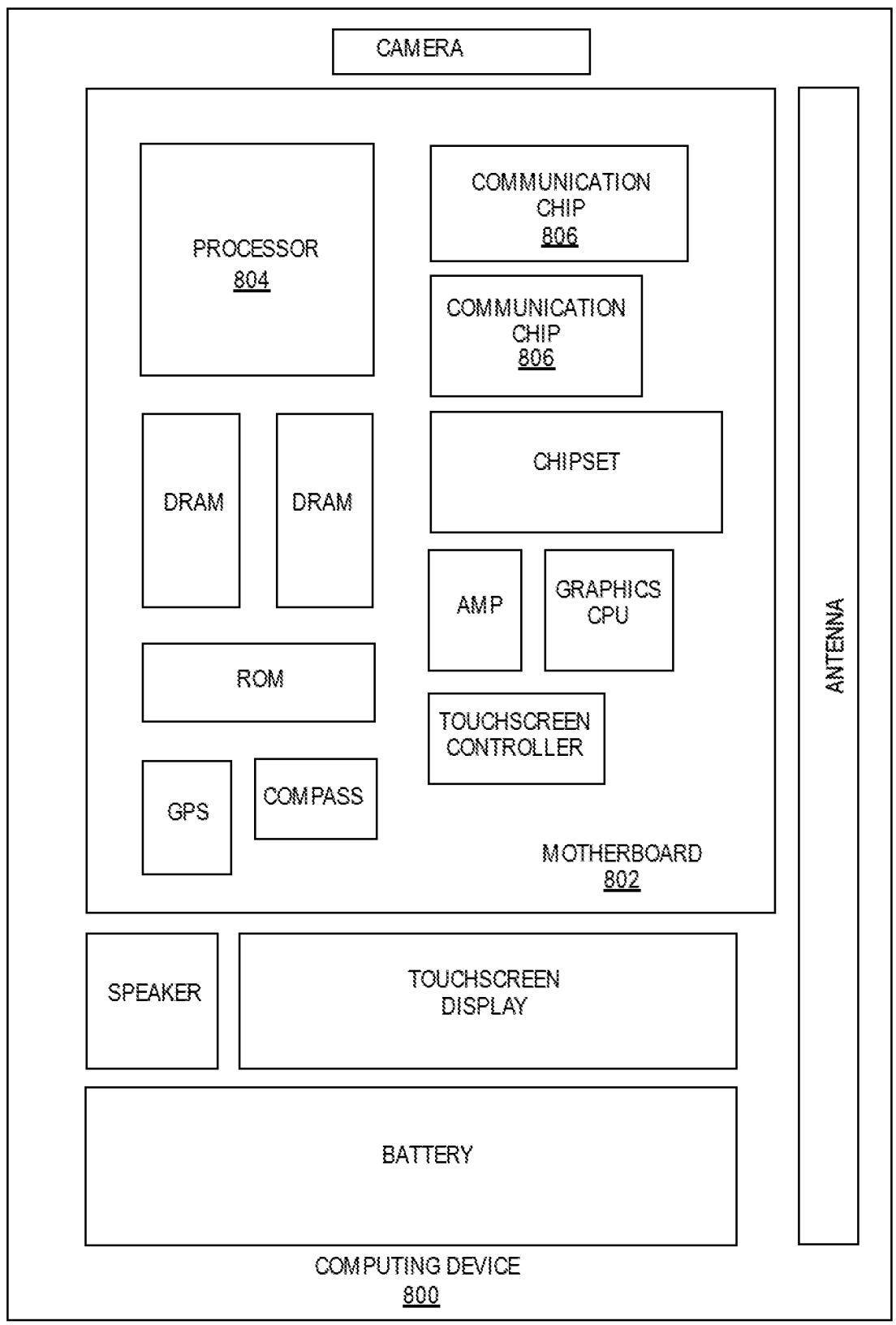
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be communicatively coupled to an organic electronic package that includes a plurality of capacitors with visual indicators, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be communicatively coupled to an organic electronic package that includes a plurality of capacitors with visual indicators, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1 a method of stress testing an electronics package, comprising: populating a plurality of components on an electronics package, wherein the plurality of components each comprise a visual indicator that is responsive to heat; stress testing the electronics package; categorizing the plurality of components based on the visual indicators; and modifying the plurality of components.

Example 2 the method of Example 1, wherein the visual indicator comprises a first band and a second band, wherein the visual indicator changes from the first band to the second band at a first temperature.

Example 3 the method of Example 1 or Example 2, wherein the visual indicator further comprises a third band, wherein the visual indicator changes from the second band to the third band at a second temperature.

Example 4 the method of Examples 1-3, wherein the first band corresponds to a component that is operating in a first performance band, wherein the second band corresponds to a component that is operating in a second performance band, and wherein the third band corresponds to a component that is operating in a third performance band.

Example 5 the method of Examples 1-4, wherein the second performance band is an optimal performance band.

Example 6 the method of Examples 1-5, wherein modifying the plurality of components comprises removing components that are operating in the first performance band.

Example 7 the method of Examples 1-6, wherein modifying the plurality of components comprises adding additional components to the plurality of components proximate to components that are operating in the third performance band.

Example 8 the method of Examples 1-7, further comprising: stress testing the electronics package a second time after modifying the plurality of components.

Example 9 the method of Examples 1-8, wherein the visual indicator comprises thermochromic thermal paint.

Example 10 the method of Examples 1-9, wherein the thermochromic paint changes from a first color to a second color at a first temperature.

Example 11 the method of Examples 1-10, wherein the thermochromic paint changes color from the second color to a third color at a second temperature.

Example 12 the method of Examples 1-11, wherein the visual indicator is permanent, or wherein the visual indicator is reversible.

Example 13 the method of Examples 1-12, wherein the plurality of components comprise one or more of capacitors, inductors, resistors, or any other power delivery component.

Example 14 a capacitor comprising: a capacitor body; electrical contacts coupled to the capacitor body; a visual indicator on the capacitor body, wherein the visual indicator changes from a first band to a second band when the capacitor body is heated to a first temperature.

Example 15 the capacitor of Example 14, wherein the visual indicator is formed over a surface of the capacitor body opposite from the electrical contacts.

Example 16 the capacitor of Example 14 or Example 15, wherein the visual indicator is integrated into the capacitor body.

Example 17 the capacitor of Examples 14-16, wherein the visual indicator is thermochromic paint.

Example 18 the capacitor of Examples 14-17, wherein the visual indicator is a sticker.

Example 19 the capacitor of Examples 14-18, wherein the visual indicator is reversible.

Example 20 the capacitor of Examples 14-19, wherein the visual indicator is permanent.

Example 21 the capacitor of Examples 14-20, wherein the visual indicator changes from the second band to a third band when the capacitor body is heated to a second temperature.

Example 22 the capacitor of Examples 14-21, wherein the first band is a first color, the second band is a second color, and the third band is a third color.

Example 23 an electronics testing device, comprising: a package substrate; a semiconductor die, electrically coupled to the package substrate; and a plurality of capacitors coupled to a power rail of the package substrate, wherein the plurality of capacitors each comprise a visual indicator.

Example 24 the electronics testing device of Example 23, wherein the visual indicator is a thermochromic paint.

Example 25 the electronics testing device of Example 23 or Example 24, wherein the thermochromic paint changes color at a first temperature and at a second temperature.

What is claimed is:

1. A method of stress testing an electronics package, comprising:
    populating a plurality of components on an electronics package, wherein the plurality of components each comprise a visual indicator that is responsive to heat, wherein the visual indicator comprises a first visual indicator component having a first color change and second visual indicator component having a second color change, the second color change different from the first color change;
    stress testing the electronics package;
    categorizing the plurality of components based on the visual indicators; and
    modifying the plurality of components.

2. The method of claim 1, wherein the visual indicator comprises a first band and a second band, wherein the visual indicator changes from the first band to the second band at a first temperature.

3. The method of claim 2, wherein the visual indicator further comprises a third band, wherein the visual indicator changes from the second band to the third band at a second temperature.

4. The method of claim 3, wherein the first band corresponds to a component that is operating in a first performance band, wherein the second band corresponds to a component that is operating in a second performance band, and wherein the third band corresponds to a component that is operating in a third performance band.

5. The method of claim 4, wherein the second performance band is an optimal performance band.

6. The method of claim 5, wherein modifying the plurality of components comprises removing components that are operating in the first performance band.

7. The method of claim 5, wherein modifying the plurality of components comprises adding additional components to the plurality of components proximate to components that are operating in the third performance band.

8. The method of claim 1, further comprising:
    stress testing the electronics package a second time after modifying the plurality of components.

9. The method of claim 1, wherein the visual indicator comprises thermochromic thermal paint.

10. The method of claim 9, wherein the thermochromic paint changes from a first color to a second color at a first temperature.

11. The method of claim 10, wherein the thermochromic paint changes color from the second color to a third color at a second temperature.

12. The method of claim 1, wherein the visual indicator is permanent, or wherein the visual indicator is reversible.

13. The method of claim 1, wherein the plurality of components comprise one or more of capacitors, inductors, resistors, or any other power delivery component.

14. A capacitor comprising:
    a capacitor body;
    electrical contacts coupled to the capacitor body;
    a visual indicator on the capacitor body, wherein the visual indicator changes from a first band to a second band when the capacitor body is heated to a first temperature, wherein the visual indicator comprises a first visual indicator component having a first color change and second visual indicator component having a second color change, the second color change different from the first color change.

15. The capacitor of claim 14, wherein the visual indicator is formed over a surface of the capacitor body opposite from the electrical contacts.

16. The capacitor of claim 14, wherein the visual indicator is integrated into the capacitor body.

17. The capacitor of claim 14, wherein the visual indicator is thermochromic paint.

18. The capacitor of claim 14, wherein the visual indicator is a sticker.

19. The capacitor of claim 14, wherein the visual indicator is reversible.

20. The capacitor of claim 14, wherein the visual indicator is permanent.

21. The capacitor of claim 14, wherein the visual indicator changes from the second band to a third band when the capacitor body is heated to a second temperature.

22. The capacitor of claim 21, wherein the first band is a first color, the second band is a second color, and the third band is a third color.

23. An electronics testing device, comprising:
    a package substrate;
    a semiconductor die, electrically coupled to the package substrate; and
    a plurality of capacitors coupled to a power rail of the package substrate, wherein the plurality of capacitors each comprise a visual indicator, wherein the visual indicator comprises a first visual indicator component having a first color change and second visual indicator component having a second color change, the second color change different from the first color change.

24. The electronics testing device of claim 23, wherein the visual indicator is a thermochromic paint.

25. The electronics testing device of claim 24, wherein the thermochromic paint changes color at a first temperature and at a second temperature.

26. A method of stress testing an electronics package, comprising:
    populating a plurality of components on an electronics package, wherein the plurality of components each comprise a visual indicator that is responsive to heat;
    stress testing the electronics package;
    categorizing the plurality of components based on the visual indicators; and
    modifying the plurality of components, wherein the visual indicator comprises a first band and a second band, wherein the visual indicator changes from the first band to the second band at a first temperature, wherein the visual indicator further comprises a third band, wherein the visual indicator changes from the second band to the third band at a second temperature, wherein the first band corresponds to a component that is operating in a first performance band, wherein the second band corresponds to a component that is operating in a second performance band, and wherein the third band corresponds to a component that is operating in a third performance band, wherein the second performance band is an optimal performance band, and wherein modifying the plurality of components comprises removing components that are operating in the first performance band.

27. A method of stress testing an electronics package, comprising:
    populating a plurality of components on an electronics package, wherein the plurality of components each comprise a visual indicator that is responsive to heat;
    stress testing the electronics package;
    categorizing the plurality of components based on the visual indicators; and
    modifying the plurality of components, wherein the visual indicator comprises a first band and a second band, wherein the visual indicator changes from the first band to the second band at a first temperature, wherein the visual indicator further comprises a third band, wherein the visual indicator changes from the second band to the third band at a second temperature, wherein the first band corresponds to a component that is operating in a first performance band, wherein the second band corresponds to a component that is operating in a second performance band, and wherein the third band corresponds to a component that is operating in a third performance band, wherein the second performance band is an optimal performance band, and wherein modifying the plurality of components comprises adding additional components to the plurality of components proximate to components that are operating in the third performance band.

\* \* \* \* \*